United States Patent [19]
Tanabe

[11] Patent Number: 5,275,894
[45] Date of Patent: Jan. 4, 1994

[54] PHASE SHIFTING MASK
[75] Inventor: Hiroyoshi Tanabe, Tokyo, Japan
[73] Assignee: NEC Corporation, Tokyo, Japan
[21] Appl. No.: 812,821
[22] Filed: Dec. 24, 1991
[30] Foreign Application Priority Data
  Dec. 25, 1990 [JP] Japan .................... 2-405600
[51] Int. Cl.$^5$ .................................. G03F 9/00
[52] U.S. Cl. ....................... 430/5; 430/320; 430/321
[58] Field of Search ................ 430/5, 320, 321
[56] References Cited

U.S. PATENT DOCUMENTS
5,045,417  9/1991  Okamoto ................... 430/5

FOREIGN PATENT DOCUMENTS
0395425  10/1990  European Pat. Off. .
0451307  10/1991  European Pat. Off. .
3156459   7/1991  Japan .

OTHER PUBLICATIONS
Patent Abstracts of Japan, vol. 15, No. 391 (P-1259) Oct. 3, 1991.

*Primary Examiner*—Marion E. McCamish
*Assistant Examiner*—Mark A. Chapman
*Attorney, Agent, or Firm*—Sughrue, Mion, Zinn Macpeak & Seas

[57] ABSTRACT

A phase shifting mask includes an opaque layer having three adjacent apertures which comprise a predetermined pattern, and at least two phase shifters each having a different shift amount. At least two of the apertures are covered with the phase shifters so that a phase difference between each two adjacent apertures is approximately 120° ($\frac{1}{3}\lambda$). Therefore, light intensity at a medial area between each two adjacent aperture is decreased in comparison with independent lights passing through the apertures.

6 Claims, 12 Drawing Sheets

FIG. IA PRIOR ART
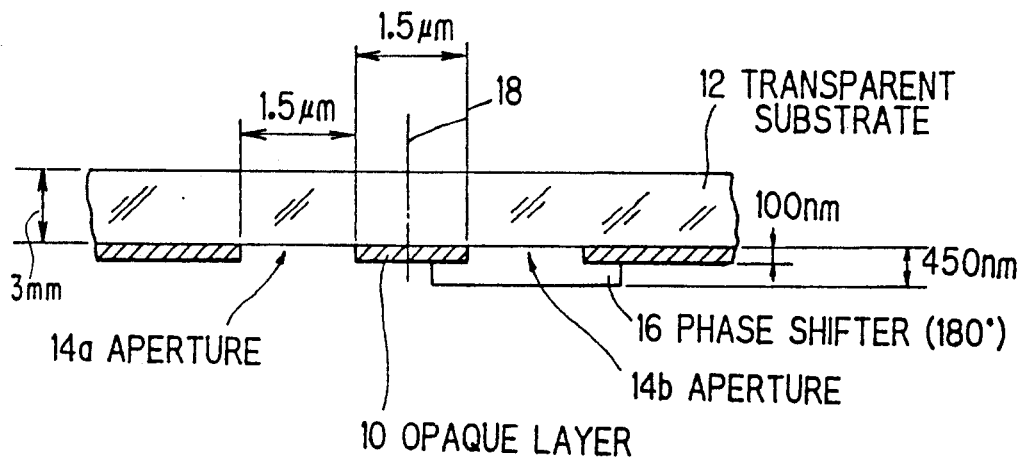
FIG. IB PRIOR ART
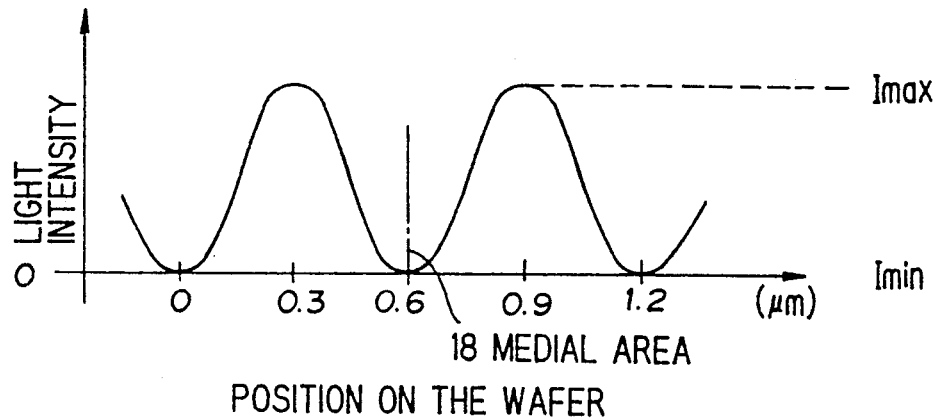
FIG. IC PRIOR ART
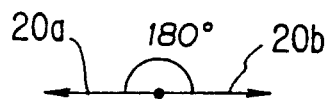

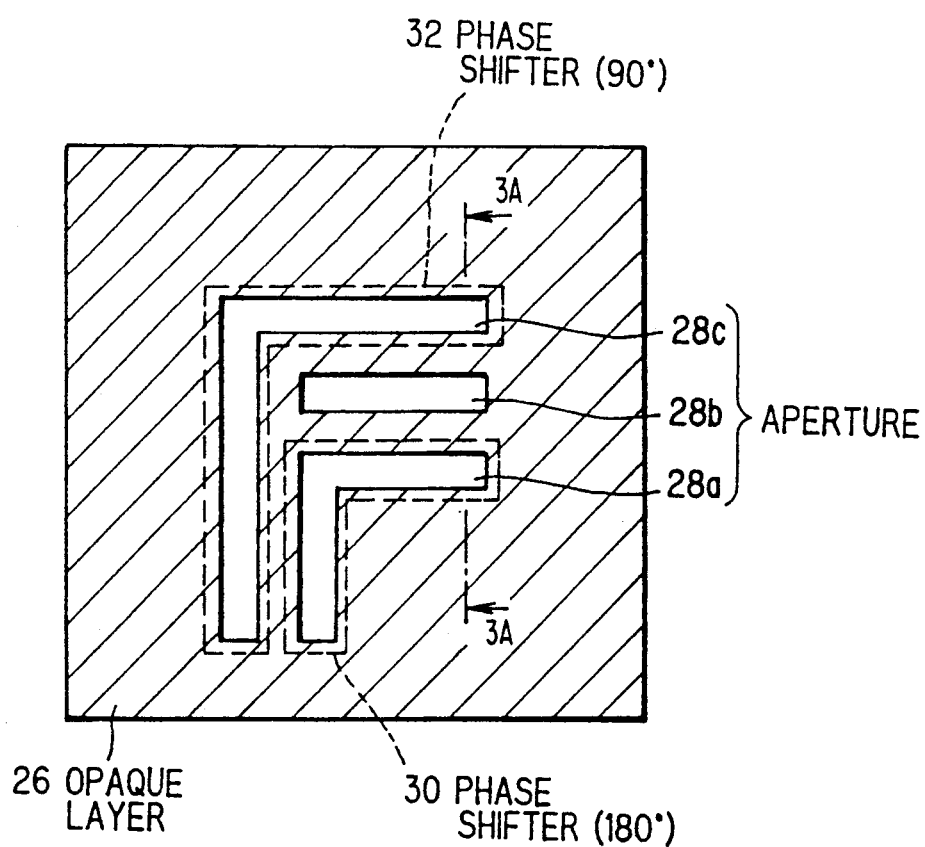

POSITION ON THE WAFER

PHASE SHIFTING MASK

FIELD OF THE INVENTION

This invention relates to a phase shifting mask, and more particularly to, a phase shifting mask used in an exposure apparatus for fabricating a semiconductor device.

BACKGROUND OF THE INVENTION

Recently, photolithography technology widely adopted in an exposure apparatus for fabricating a semiconductor device such as VLSI. The exposure apparatus is provided with a mask having many apertures composing a predetermined pattern, a projection lens positioned under the mask, and a wafer positioned under the projection lens.

In the exposure apparatus, when coherent illumination is transmitted through the mask and the projection lens, the predetermined pattern is printed on a surface of the wafer to be scale-downed. According to the exposure apparatus, however, there is a problem in that resolution of the printed pattern is decreased because of interference effect, if the mask has several adjacent apertures.

Accordingly, a phase shifting mask using a phase shifter is proposed to solve the above problem.

A conventional phase shifting mask is provided with two adjacent apertures in which one of the apertures is covered with a phase shifter of 180° ($\frac{1}{2}\lambda$) and the other is not covered with anything as described in Japanese Patent Publication No. 50811 of 1987. According to the conventional phase shifting mask, a phase difference between the two adjacent apertures is 180° ($\frac{1}{2}\lambda$), so that contrast on a wafer is high. In the same manner, when three adjacent apertures are formed on the mask, a first aperture is covered with a phase shifter of 90° ($\frac{1}{4}\lambda$), a second aperture is covered with a phase shifter of 180° ($\frac{1}{2}\lambda$) and a third aperture is not covered with anything. According to the phase shifting mask, contrast on a wafer is generally high. However, contrast at medial areas between the first and second apertures and the first and third apertures is not sufficiently high, because each phase difference between them is 90° ($\frac{1}{4}\lambda$).

A phase shifting mask in which a plurality of small apertures covered with predetermined phase shifters, respectively, are formed around a main aperture is described in Japanese Patent Kokai No. 67514 of 1987. Further, a phase shifting mask in which a plurality of apertures are covered with phase shifters each having different shift amount is described on pages 491 and 492 of a preliminary report of "the 51 st applied physics institute lecture conference" of the autumn season, 1990 entitled "Fine Pattern Fabrication with Multistage Phase Shifter" and "A study of phase shifting mask construction applied for positive resist process" (JSAP Catalog Number: AP 901125-02). However, the phase shifting masks have a different object from the present invention.

Finally, it is noted that, a phase shifting mask in which a phase shifter having fine structure smaller than resolving power of the optical system is used as shading means instead of an opaque layer such as chromium is described on page 490 of the above preliminary report entitled "Transparent phase shift mask" (JSAP Catalog Number: AP 901125-02).

SUMMARY OF THE INVENTION

It is an object of the present invention to provide a phase shifting mask which produces high resolution even if three adjacent apertures are formed thereon.

According to the invention, a phase shifting mask includes:

a photo-mask member having three adjacent apertures which are a part of a predetermined mask pattern; and at least two phase shifters for covering at least two of the three adjacent apertures to provide the three adjacent apertures with three phase shift amounts $\phi 1$, $\phi 2$ and $\phi 3$;

wherein the three phase shift amounts $\phi 1$, $\phi 2$ and $\phi 3$ satisfy the equations;

$$|\phi 1 - \phi 2 + n \times 360°| \approx 120°$$

$$|\phi 2 - \phi 3 + m \times 360°| \approx 120°$$

$$|\phi 3 - \phi 1 + k \times 360°| \approx 120°$$

when n, m and k are arbitrary integers.

BRIEF DESCRIPTION OF THE DRAWINGS

The invention will be explained in more detail in conjunction the appended drawings; wherein:

FIG. 1A is a cross-sectional view showing a first conventional phase shifting mask;

FIG. 1B is an optical intensity distribution on a wafer according to the first conventional phase sifting mask;

FIG. 1C is a vector model of the first conventional phase shifting mask;

FIG. 2 is a plane view showing a second conventional phase shifting mask;

DESCRIPTION OF THE PREFERRED EMBODIMENTS

Figure 3A:
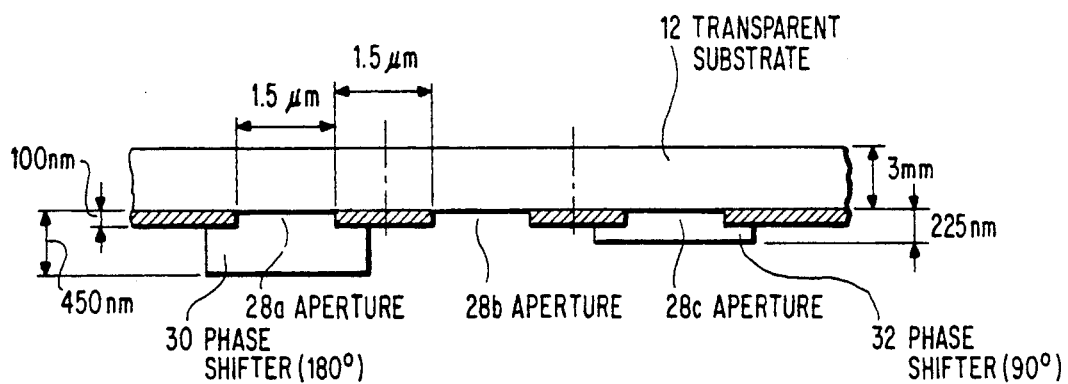
FIG. 3A is a cross-sectional view taken on line Y—Y of FIG. 2.

Before describing a phase shifting mask according to the invention, the aforementioned conventional phase shifting masks will be explained in conjunction with FIGS. 1A, 1B, 1C, 2, 3A, 3B and 3C.

A first conventional phase shifting mask shown in FIG. 1A includes a transparent substrate 12 having a thickness of 3 mm, an opaque layer 10 such as chromium having a thickness of 100 nm for shading illumination, and a phase shifter 16 of 180° ($\frac{1}{2}\lambda$) having a thickness of 450 nm. The opaque layer 10 is formed to have many apertures including two adjacent apertures 14a and 14b to provide a predetermined pattern. The aperture 14b is covered with the phase shifter 16.

In operation, when coherent illumination is radiated to the phase shifting mask, the illumination passes through the apertures 14a and 14b and is shaded at the other opaque area. At this time, the transmitting light of the aperture 14b is shifted to 180° ($\frac{1}{2}\lambda$) by the phase shifter 16. Then, it is supposed that vectors 20a and 20b are amplitude of the light passing through the aperture 14a and 14b, respectively, and an absolute amplitude of a synthetic light is zero as shown in FIG. 1C. Therefore, synthetic light intensity on a wafer (not shown) at a medial area 18 between the apertures 14a and 14b is zero as shown in FIG. 1B. As the result, a pattern contrast on the wafer which is calculated to be (Imax−Imin)/(Imax+Imin) is high.

A second conventional phase shifting mask shown in FIGS. 2 and 3A includes a transparent substrate 12 having a thickness of 3 mm, an opaque layer 26 having a thickness of 100 nm for shading illumination, and a phase shifters 30 of 180° ($\frac{1}{2}\lambda$) and 32 of 90° ($\frac{1}{4}\lambda$) having thicknesses of 450 nm and 225 nm, respectively. The opaque layer 26 is formed to have many apertures including three adjacent apertures 28a, 28b and 28c to provide a predetermined pattern. The apertures 28a and 28c are covered with the phase shifters 30 and 32, respectively, so that phase difference between the apertures 28a and 28b is 180° ($\frac{1}{2}\lambda$), and those between the apertures 28b and 28c and the apertures 28a and 28c are 90° ($\frac{1}{4}\lambda$).

Figure 3B:
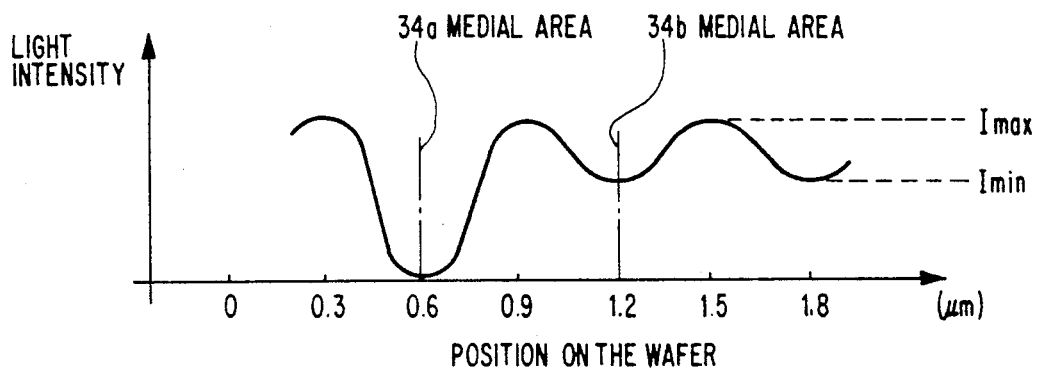
FIG. 3B is an optical intensity distribution on a wafer according to the second conventional phase shifting mask.

In operation, when coherent illumination is radiated to the phase shifting mask, the illumination passes through the apertures 28a, 28b and 28c. At this time, phases of the lights passing through the apertures 28a and 28c are shifted to 180° ($\frac{1}{2}\lambda$) and 90° ($\frac{1}{4}\lambda$) by the phase shifters 30 and 32, respectively. As the result, an absolute amplitude of a synthetic light is zero, so that synthetic light intensity on a wafer (not shown) at a medial area 34a is zero, as shown in FIG. 3B, in the same manner as the first conventional mask.

Figure 3C:
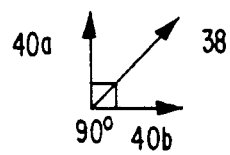
FIG. 3C is a vector model of the second conventional phase shifting mask.

Then, if it is supposed that vectors 40a and 40b are amplitudes of the lights passing through the apertures 28b and 28c, respectively, a synthetic amplitude 38 is a square root of the amplitudes 40a and 40b as shown in FIG. 3C. Synthetic light intensity at a medial area 34b on a wafer (not shown) is calculated to be multiplied by an absolute amplitude. Therefore, the synthetic light intensity is twice as much as each of independent intensities of lights passing through the apertures 28b and 28c. As the result, the synthetic light intensity at the medial area 34b is higher than the medial area 34a.

According to the second conventional phase shifting mask, however, there is a disadvantage in that resolution on the wafer is low at the medial area 34b, because the synthetic light intensity at the medial area 34b is high. As the result, the contrast is the same as incoherent illumination.

Figure 4:
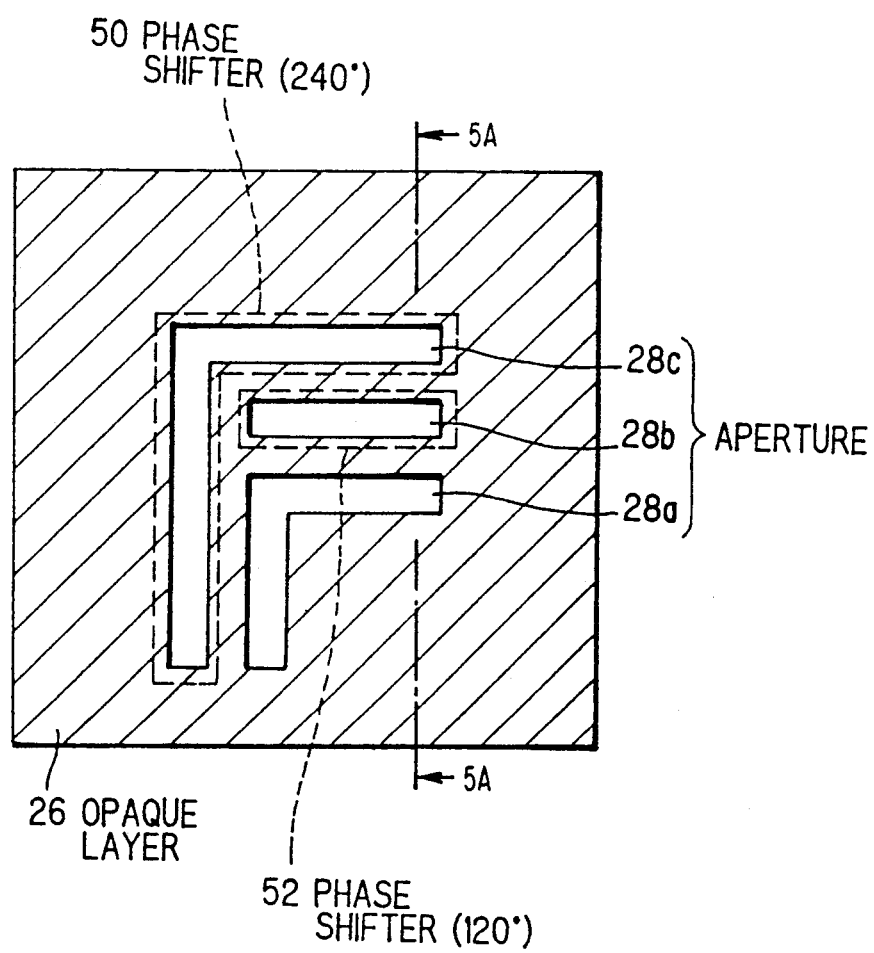
FIG. 4 is a plane view showing a phase shifting mask of a first preferred embodiment according to the invention.
Figure 5A:
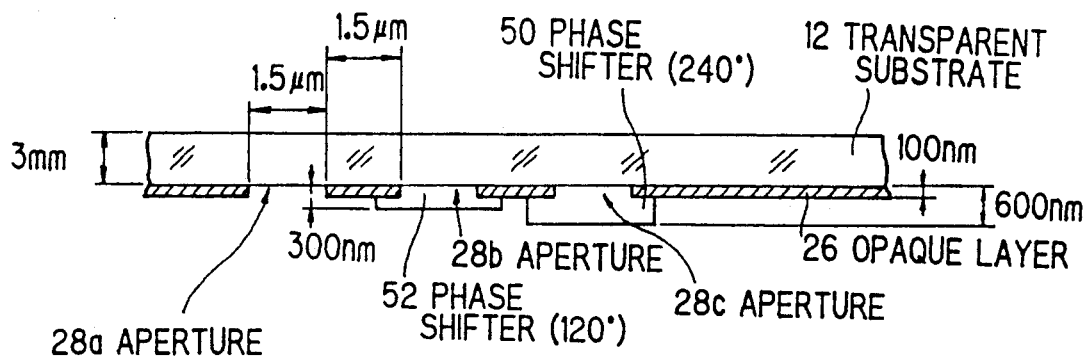
FIG. 5A is a cross-sectional view taken on line Y—Y of FIG. 4.
Figure 5B:
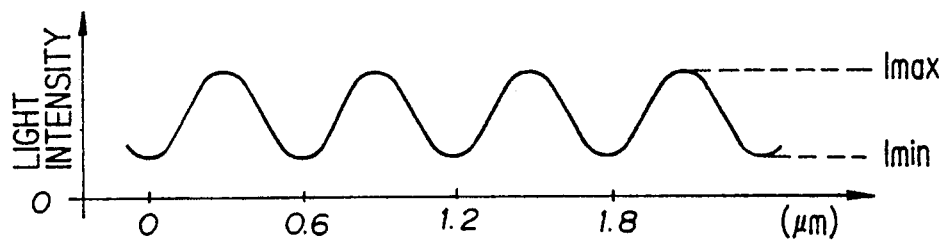
FIG. 5B is an optical intensity distribution on a wafer according to the first preferred embodiment.

Next, a phase shifting mask of a first preferred embodiment according to the invention will be explained in conjunction with FIGS. 4 and 5A. The phase shifting mask includes a transparent substrate 12 having a thickness of 3 mm, an opaque layer 26 having a thickness of 100 nm for shading illumination, and a phase shifter 50 of 240° ($\frac{2}{3}\lambda$) having a thickness of 600 nm and a phase shifter 52 of 120° ($\frac{1}{3}\lambda$) having a thickness of 300 nm. The opaque layer 26 is formed to have many apertures including three adjacent apertures 28a, 28b and 28c each having a width and a distance of 1.5 μm, and a predetermined pattern is formed by the apertures. The apertures 28b and 28c are covered with the phase shifters 52 and 50, respectively, so that phase difference between each two adjacent apertures is 120° ($\frac{1}{3}\lambda$). Provided that a phase difference may be changed in the range of approximately 100° to 140° (120°±20°) depending on process precision of the phase shifters 50 and 52.

In operation, when coherent illumination is radiated to the phase shifting mask, the illumination passes through the apertures 28a, 28b and 28c. At this time, phases of lights passing through the apertures 28b and 28c are shifted to 120° ($\frac{1}{3}\lambda$) and 240° ($\frac{2}{3}\lambda$) by the phase shifters 52 and 50, respectively. As the result, an absolute amplitude of a synthetic light is equal to non-interfered light, so that synthetic light intensity at a medial area between each two adjacent apertures becomes equal to independent lights passing through the apertures 28a, 28b and 28c.

Figure 5C:
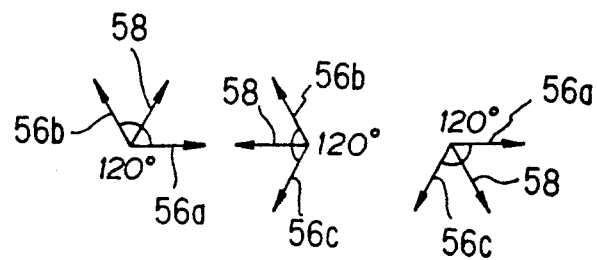
FIG. 5C is a vector model of the first preferred embodiment.

In more detail, it is supposed that vectors 56a, 56b and 56c are amplitudes of the lights passing through the apertures 28a, 28b and 28c, respectively, as shown in FIG. 5C. In the vector models, a synthetic amplitude 58 is equal to the amplitudes 56a, 56b and 56c, so that synthetic light intensity calculated to be multiplied by an absolute value of synthetic amplitude 58 at a medial area is equal to individual intensities of the lights passing through the apertures 28a, 28b and 28c.

Figure 6:
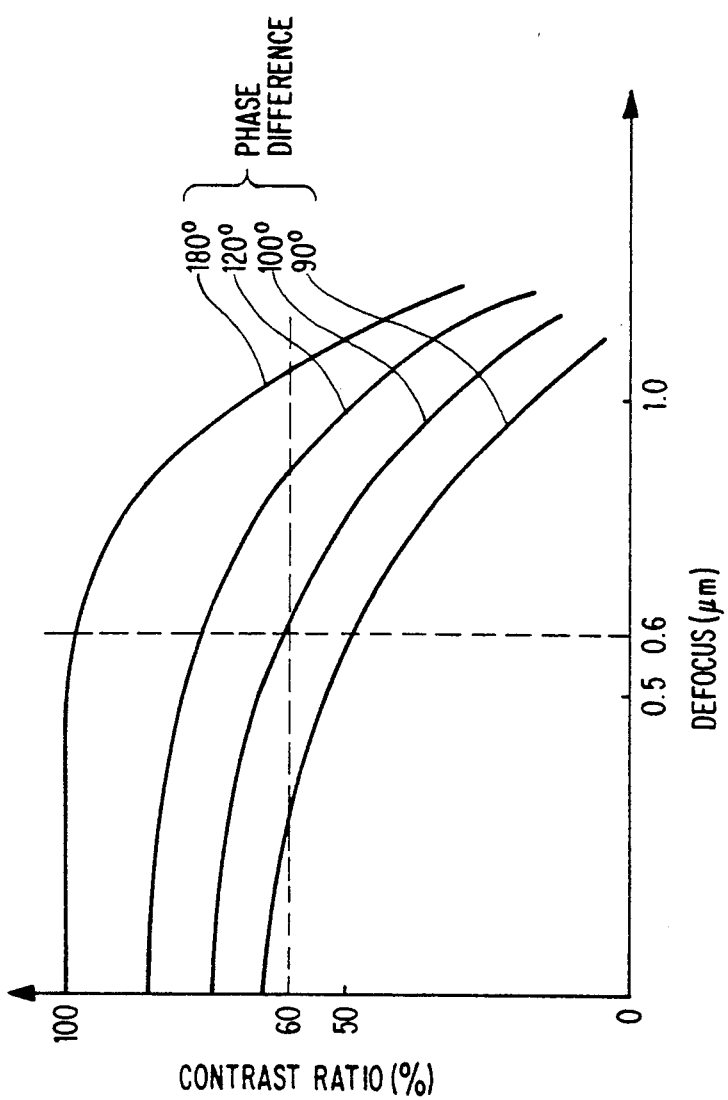
FIG. 6 is a graph showing a contrast ratio for explaining difference between the invention and the conventional one.

FIG. 6 shows a contrast ratio in accordance with a phase difference between two adjacent apertures on the condition that widths of the apertures and the opaque layer 26 are 0.3 μm, wave length λ=365 nm, NA (numerical aperture) of a scale-down lens is 0.5, and coherence factor σ=0.3. As shown in this graph, when a phase difference is 120° ($\frac{1}{3}\lambda$) according to the preferred embodiment, a contrast ratio is quite higher than a value at the time of a phase difference of 90° ($\frac{1}{4}\lambda$) in the conventional phase shifting mask. Further, according to the first preferred embodiment, the depth of focus can be expanded to 1.8 μm (or ±0.9 μm), because a printed pattern can be resolved when the contrast ratio is more than 60 percent. The depth of focus 1.8 μm is larger than minimum depth of focus 1.2 μm (or ±0.6 μm) for a semiconductor fabrication.

Next, second to seventh preferred embodiments according to the invention will be explained. It is noticed that the same or corresponding structure and components will be omitted to avoid overlapped explanation.

Figure 7:
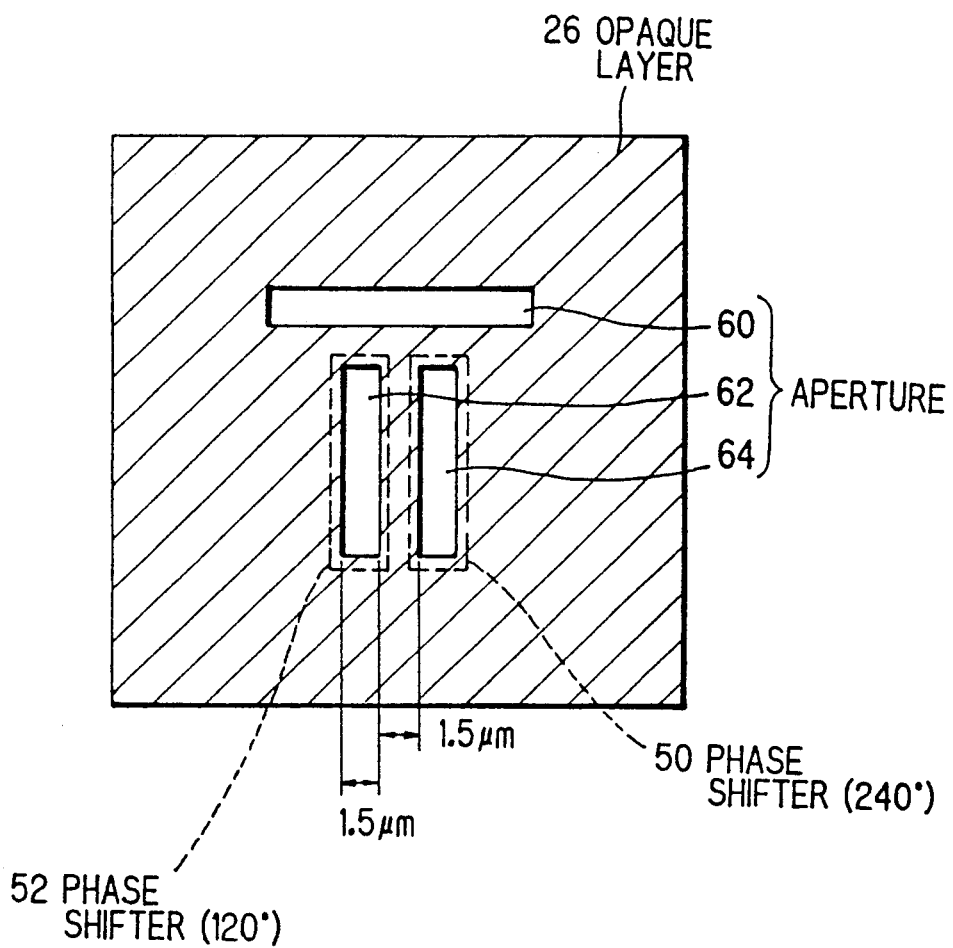
FIG. 7 is a plane view showing a phase shifting mask of a second preferred embodiment according to the invention.

FIG. 7 shows a phase shifting mask of a second preferred embodiment according to the invention. The phase shifting mask is provided with an opaque layer 26 having three adjacent apertures 60, 62 and 64 each having a width of 1.5 μm and a distance of 1.5 μm. The apertures 62 and 64 are formed in parallel and the aperture 60 is formed above the apertures 62 and 64. The apertures 62 and 64 are covered with a phase shifter 52 of 120° (⅓λ) and a shifter 54 of 240° (⅔λ), and the aperture 60 is not covered with anything. According to the second preferred embodiment, the same operation and the same effect can be obtained as the first preferred embodiment.

Figure 8:
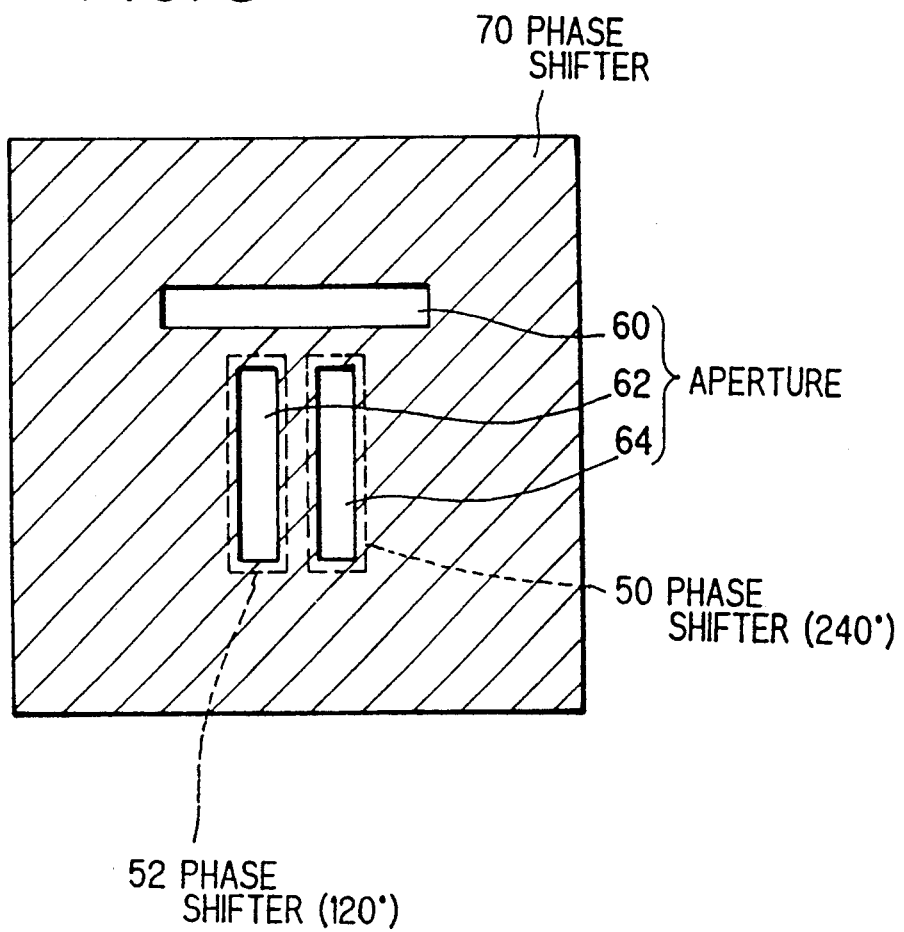
FIG. 8 is a plane view showing a phase shifting mask of a third preferred embodiment according to the invention.

FIG. 8 shows a phase shifting mask of a third preferred embodiment according to the invention. The phase shifting mask is provided with a phase shifter 70 as shading means instead of the opaque layer 26 of the first and second preferred embodiments. The phase shifter 70 has a fine structure smaller than the resolving power of the optical system. According to the third preferred embodiment, an opaque layer can be omitted, so that the step number of a fabrication process is decreased.

Figure 9:
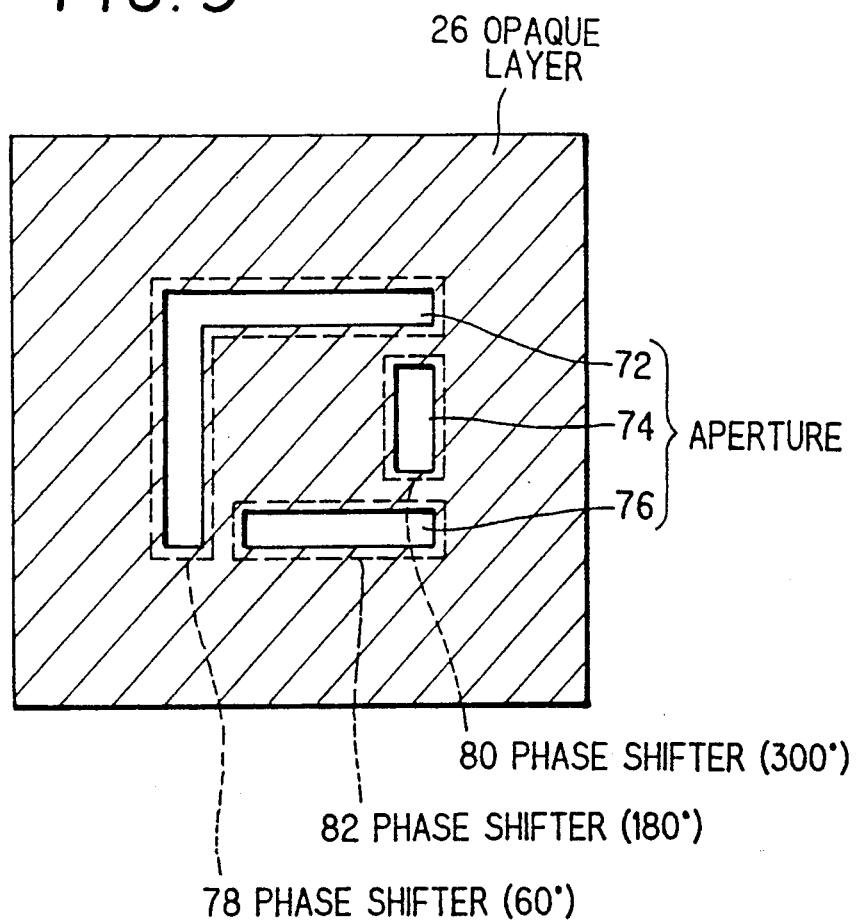
FIG. 9 is a plane view showing a phase shifting mask of a fourth preferred embodiment according to the invention.

FIG. 9 shows a phase shifting mask of a fourth preferred embodiment according to the invention. The phase shifting mask includes an opaque layer 26 having three adjacent aperture 72, 74 and 76 which are shaped to form a square, and three phase shifters 78, 80 and 82 having shift amounts of 60° (1/6 λ), 300° (5/6 λ) and 180° (½λ), respectively.

The apertures 72, 74 and 76 are covered with the phase shifters 78, 80 and 82, respectively.

Figure 10:
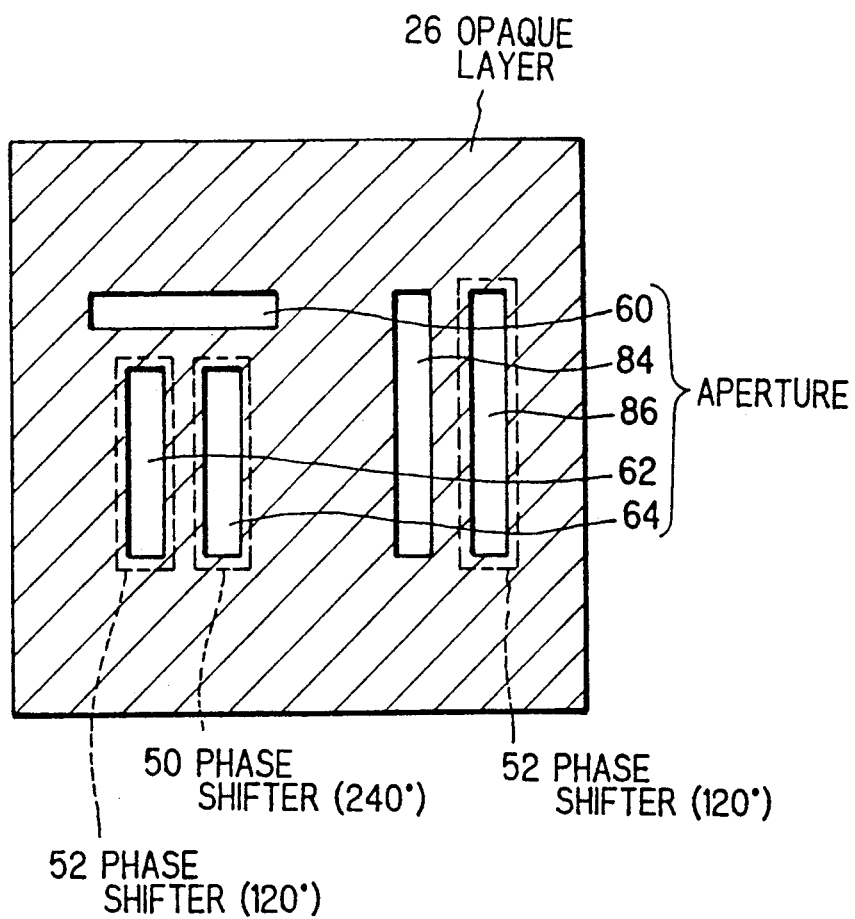
FIG. 10 is a plane view showing a phase shifting mask of a fifth preferred embodiment according to the invention.

FIG. 10 shows a phase shifting mask of a fifth preferred embodiment according to the invention.

The phase shifting mask is provided with an opaque layer 26 having two sets of adjacent apertures including three adjacent apertures 60, 62 and 64 and two adjacent apertures 84 and 86. Each of the apertures 62 and 86 is covered with a phase shifter 52 of 120° (⅓λ), and the aperture 64 is covered with a phase shifter 50 of 240° (⅔λ). According to the fifth preferred embodiment, a phase difference between each two adjacent apertures is 120° (⅓λ), so that resolution of a printed pattern is wholly high on a wafer (not shown).

Figure 11:
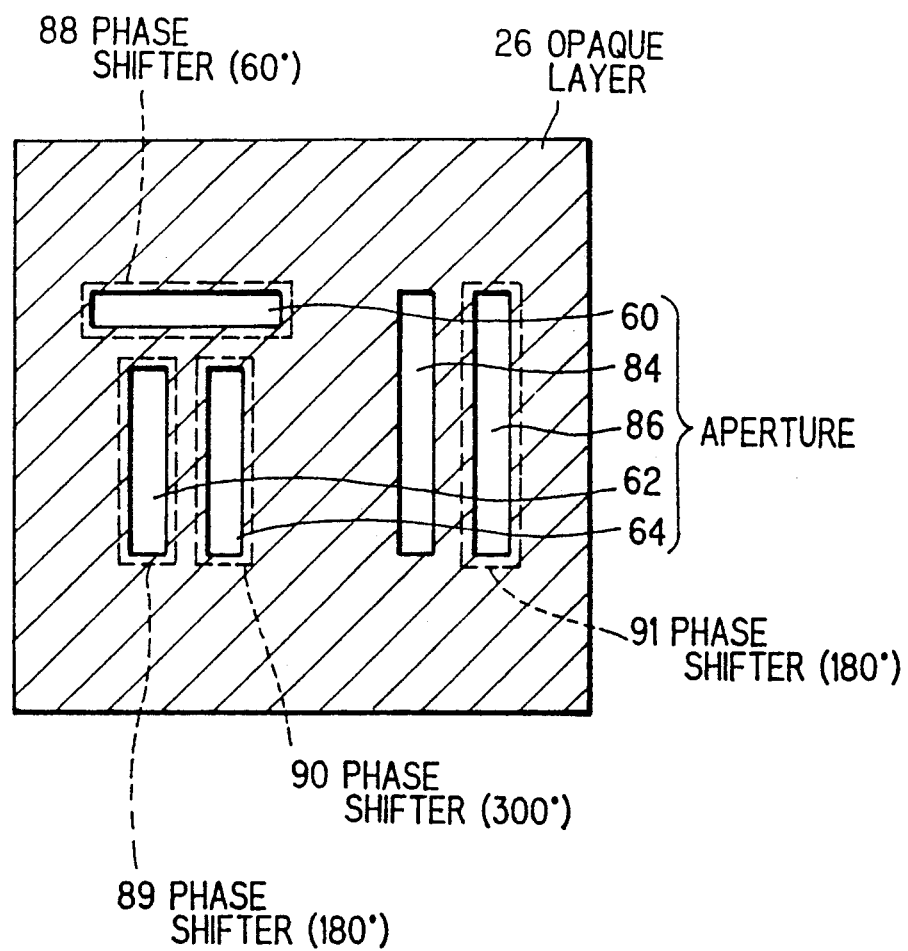
FIG. 11 is a plane view showing a phase shifting mask of a sixth preferred embodiment according to the invention.

FIG. 11 shows a phase shifting mask of a sixth preferred embodiment according to the invention.

The phase shifting mask has the same structure as that of the fifth preferred embodiment shown in FIG. 10 except for phase shifters. That is, the phase shifting mask is provided with four phase shifters 88 to 91. The aperture 60 is covered with the phase shifter 88 of 60° (1/6 λ), the aperture 62 is covered with the phase shifter 89 of 180° (½λ), the aperture 64 is covered with the phase shifter 90 of 300° (5/6 λ) and the aperture 86 is covered with the phase shifter 91 of 180° (½λ), respectively. According to the sixth preferred embodiment, a phase difference between the apertures 84 and 86 is 180° (½λ), so that resolution at a medial area between two adjacent apertures 84 and 86 is higher than that of the fifth preferred embodiment.

Figure 12A:
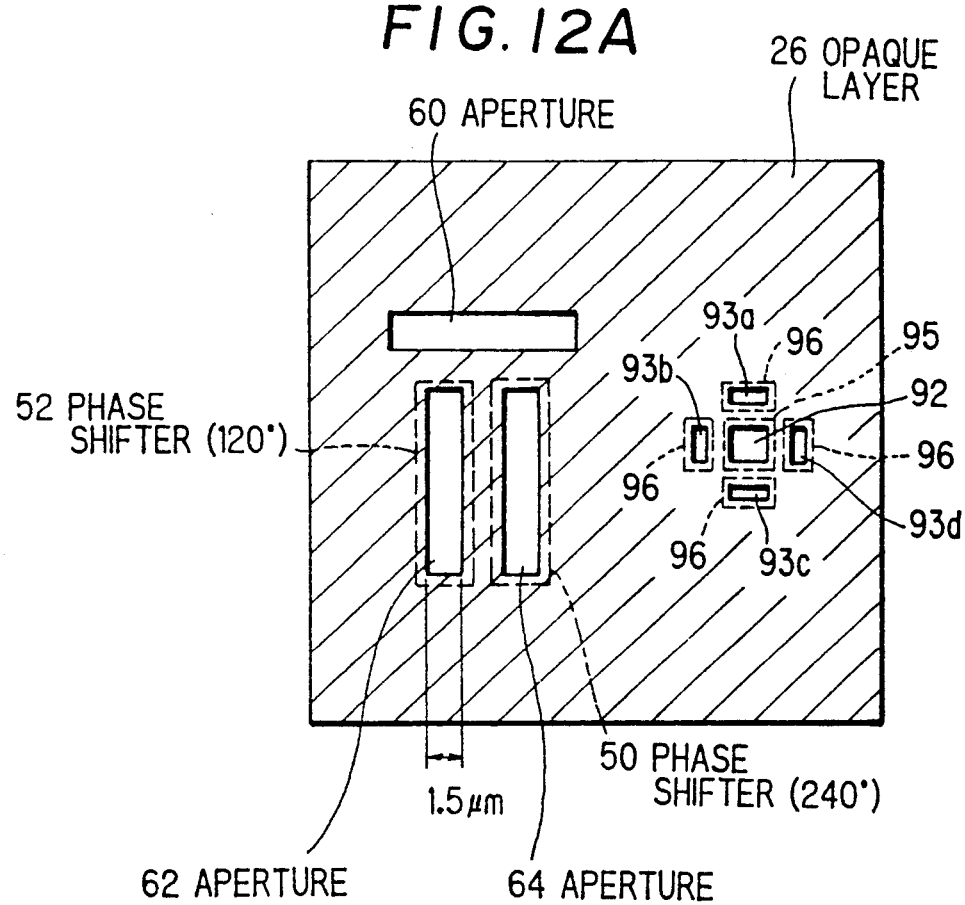
FIG. 12A is a plane view showing a phase shifting mask of a seventh preferred embodiment according to the invention.
Figure 12B:
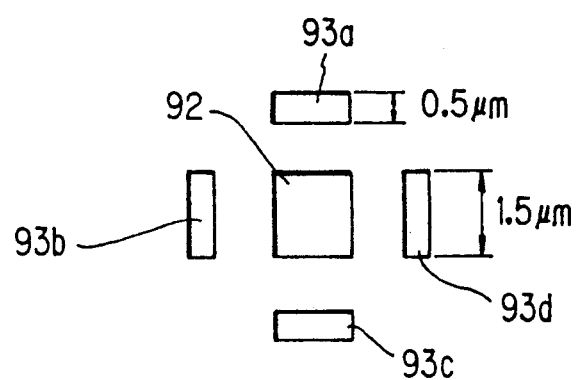
FIG. 12B is an enlarged view showing a principal part of the seventh preferred embodiment shown in FIG. 12A.

FIGS. 12A and 12B show a phase shifting mask of a seventh preferred embodiment according to the invention. The phase shifting mask includes an opaque layer 26 having three adjacent apertures 60, 62 and 64 and an isolated aperture 92 surrounded by four small supporting apertures 93a, 93b, 93c and 93d. The isolated aperture 92 is shaped to be square of 1.5 μm, and each of the small supporting apertures 93a, 93b, 93c and 93d has an area of 0.5 μm by 1.5 μm. The apertures 62 and 64 are covered with a phase shifter 52 of 120° (⅓λ) and a phase shifter 50 of 240° (⅔λ), respectively. The isolated aperture 92 is covered with a phase shifter 95 of 120° (⅓λ) and each of the four small supporting apertures 93a, 93b, 93c and 93d is covered with a phase shifter 96 of 240° (⅔λ). According to the seventh preferred embodiment, a phase difference between the isolated aperture 92 and the supporting apertures 93a, 93b, 93c and 93d is 120° (⅓λ), so that resolution around the isolated aperture 92 is high in the same manner as the three adjacent apertures 60, 62 and 64.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A phase shifting mask comprising:
    a photo-mask member having three adjacent apertures which are a part of a predetermined mask pattern; and
    at least two phase shifters for covering at least two of said three adjacent apertures to provide said three adjacent apertures with three phase shift amounts $\phi 1$, $\phi 2$ and $\phi 3$;
    wherein said three phase shift amounts $\phi 1$, $\phi 2$ and $\phi 3$ meet below equations;

$$|\phi 1 - \phi 2 + n \times 360°| \simeq 120°$$

$$|\phi 2 - \phi 3 + m \times 360°| \simeq 120°$$

$$|\phi 3 - \phi 1 + k \times 360°| \simeq 120°$$

when n, m and k are arbitrary integers.

2. A phase shifting mask comprising:
    a transparent substrate;
    a shading layer formed on said transparent substrate to have a plurality of apertures comprising three adjacent apertures which comprise a predetermined pattern; and
    at least two phase shifters each having a different shift amount to shift a phase of coherent illumination transmitting therethrough;
    wherein at least two of said three adjacent apertures are covered with said at least two phase shifters so that phase difference between each two adjacent apertures is 100° to 140°.

3. A phase shifting mask, according to claim 2, wherein:
    said phase difference between each two adjacent apertures is 120° (⅓λ).

4. A phase shifting mask, according to claim 2 or 3 wherein:
    said phase shifter has a fine structure and holds said shading layer in addition to means for phase shifting.

5. A phase shifting mask, according to claim 2, wherein:
    said at least two phase shifters have shift amounts of 120° (⅓λ) and 240° (⅔λ), respectively; and
    a remaining one of said adjacent apertures is not provided with a phase shifter.

6. A phase shifting mask, according to claim 2, wherein:
    said at least two phase shifters comprises three phase shifters having shift amounts of 60° (1/6 λ), 180° (½λ) and 300° (5/6 λ), respectively.

* * * * *

UNITED STATES PATENT AND TRADEMARK OFFICE
CERTIFICATE OF CORRECTION

PATENT NO. : 5,275,894
DATED : January 4, 1994
INVENTOR(S) : Hiroyoshi TANABE

It is certified that error appears in the above-indentified patent and that said Letters Patent is hereby corrected as shown below:

Col. 5, line 10, delete "1/4" and insert --1/3--.

Signed and Sealed this

Second Day of August, 1994

Attest:

BRUCE LEHMAN

Attesting Officer     Commissioner of Patents and Trademarks